United States Patent [19]

Reinhardt

[11] Patent Number: 5,441,599
[45] Date of Patent: Aug. 15, 1995

[54] LIGHTLY DOPED DRAIN ETCH METHOD FOR SEMICONDUCTOR MANUFACTURE

[75] Inventor: Karen Reinhardt, Austin, Tex.

[73] Assignee: Advanced Micro Devices, Sunnyvale, Calif.

[21] Appl. No.: 828,013

[22] Filed: Jan. 30, 1992

[51] Int. Cl.$^6$ ............................................. H01L 21/306
[52] U.S. Cl. ................................... 156/646.1; 437/44
[58] Field of Search ................. 156/651, 643; 437/44, 437/646

[56] References Cited

U.S. PATENT DOCUMENTS

| | | | |
|---|---|---|---|
| 4,601,782 | 7/1986 | Binachi et al. | 156/643 |
| 4,687,543 | 8/1987 | Bowker | 156/651 |

FOREIGN PATENT DOCUMENTS

| | | | |
|---|---|---|---|
| 1-9620 | 1/1989 | Japan | 156/651 |

OTHER PUBLICATIONS

S. H. Dhong et al., "Sidewall Spacer Technology for MOS and Bipolar Devices", *J. Electrochem. Soc.*, vol. 133, No. 2 Feb. 1986, pp. 389–396.

S. Wolf et al. *Silicon Processing for the VLSI Era*, vol. 1, Lattice Press Sunset Beach, Calif., 1986, pp. 547–551.

Connick et al., "Study of reactive-ion-etch-induced lattice damage in silicon by Ar, $CF_4$, $NF_3$, and $CHF_3$ plasmas", pp. 2059–2063, J. Appl. Phys. 64(4).

Washidzu et al., "Damage Induced by Electron Cyclotron Resonance Plasma Etching on Silicon Surface", Jap. J. Appl. Physics, 1991, pp. 1045–1049, 30(5).

Yabumoto et al., "Surface Damage on Si Substrates Caused by Reactive Sputter Etching", May 1981, pp. 893–900, Japanese J. of Appl. Phys., vol. 20, No. 5.

Fonash et al., "An Overview of Dry Etching Damage and Contamination Effects", Dec. 1990, pp. 3885–3892, J. Electrochem. Soc., vol. 137, No. 12.

Shenai et al., "The Effect of Reactive Ion Etching (RIE) in $CHF_3/CO_2$ Plasma and Successive Residual Silicon Surface Damage Removal on the Contact Characteristics of Al–nSi and Al+1% Si–nSi Contacts", 1988, pp. 179–193, ECS Proc. 88(22).

*Primary Examiner*—Tom Thomas
*Assistant Examiner*—Trung Dang
*Attorney, Agent, or Firm*—Johnson & Wortley; H. Dale Langley, Jr.

[57] ABSTRACT

A method of manufacturing a semiconductor device includes a first etch procedure that limits the extent of damage to the silicon substrate base of the semiconductor device, and a subsequent etch procedure operative to remove damaged portions of the silicon substrate base of the device remaining after the first etch procedure.

5 Claims, 1 Drawing Sheet

LIGHTLY DOPED DRAIN ETCH METHOD FOR SEMICONDUCTOR MANUFACTURE

BACKGROUND OF THE INVENTION

The present invention relates generally to the manufacture of semiconductor devices and, in a preferred embodiment thereof, more particularly relates to a two-step lightly doped drain ("LDD") etch process for manufacture of semiconductor devices.

Etching is the removal of material from areas of a workpiece by chemical means, physical means, or a combination of both. Etching in the manufacture of semiconductor devices is typically performed by employing liquids or gases or gas mixtures at particular temperatures and pressures to act upon the workpiece in a manner which subjects the workpiece to conditions achieving a desired removal effect. Special machines, often referred to as etching machines, are often employed in industry to effect such removal by creating conditions therefor and subjecting the workpiece to such conditions. Etching may be employed in the manufacture of a number of devices, including semiconductor devices. A variety of etching processes may be employed in a variety of industries, the foregoing being intended only as a general description of etching and the accompanying results.

Specifically in connection with semiconductor manufacture, etching processes can take place either in a liquid or gas phase. Further, such processes may be either chemical, physical or a combination thereof. Chemical etching in the manufacture of semiconductors removes material from the workpiece by dissolution processes. Physical etching removes such material by bombardment of the workpiece with high-energy ions.

In the typical etch process for manufacture of semiconductor devices, the device to be etched comprises a silicon substrate base having a lattice structure, such base being layered with a gate oxide material. Topping the gate oxide layer are interconnecting strips of a semiconductive material, the poly gate. The poly gate is joined at selected locations on the gate oxide layer atop the silicon substrate base to collectively define the overall semiconductor circuitry of the device. The silicon substrate base/gate oxide layer/poly gate strips assembly is topped with a layer of a spacer oxide which covers both the poly gate and those portions of the gate oxide layer not topped by the interconnecting strips of poly gate.

This device is etched using an etching machine common to the semiconductor device manufacturing industry. Such etch exposes the poly gate, removes the spacer oxide, except for bevelled ridges of spacer oxide which abut the poly gate, and removes from the surface of the silicon substrate base the portions of the gate oxide layer not sandwiched between the poly gate or spacer oxide and silicon substrate base. Such etch process yields a commercially useable form of semiconductor device.

Prior to the present invention, the industry practice has been to perform such an etch for semiconductor manufacture, using an etching machine, under conditions of (1) a gas composition comprising a noble gas, (2) low pressure, and (3) high power. Such an etch causes significant damage to the lattice structure of the silicon substrate base. The damage to the lattice structure is caused by the energetic bombardment of ions in the gas composition, which bombardment breaks the silicon bonds of the silicon substrate base and allows penetration of hydrogen and other atoms interstitially into the silicon lattice. Such an etch also results in damage from polymer formation on the exposed surface of the silicon substrate base. Ion bombardment and radiation due to reactions of the gas composition in the etch chamber, together with heavy metals and other metallic impurities sputtered off during the etch, imparts charge to the silicon substrate base's surface and deposits carbon-containing polymer thereon. Such lattice structure damage and polymer formation results in resistance problems, breakdown of oxides, and adverse hot electron effects in the semiconductor device produced in the etch process. Hereinafter, "damage" is used to refer to both damage to the lattice structure of the silicon substrate base and polymer formation on such base's surface.

It has been determined in accordance with the present invention, that as pressure decreases and power increases in the etch process noble gas ion bombardment, and thus damage to the silicon base therefrom, increases. The industry's perception and practice prior to the present invention has, nevertheless, been that the etch procedure must be accomplished under conditions of high power and low pressure and that a noble gas must be included in the gas composition used in the etch process.

The present invention, an improved LDD oxide spacer etch process, reduces damage caused in an initial etch procedure and further provides for a subsequent removal procedure for etched removal of damage caused in the initial etch procedure. Reducing damage and then removing damage restores the silicon substrate base in the semiconductor device obtained as the final product of the process to essentially that of unetched silicon, reducing the occurrence of contact resistance problems, breakdown of oxides, and adverse hot electron effects in such device.

SUMMARY OF THE INVENTION

In carrying out principles of the present invention, an oxide etch procedure is performed under conditions which, compared to the conventional etch procedures, limits the extent of damage caused in such procedure. In a preferred embodiment of the procedure, an improved LDD oxide spacer etch process, comprising a first oxide etch procedure, performed under conditions which, compared to the conventional etch processes, limit the extent of damage to the semiconductor's silicon substrate base, and a second removal procedure for etched removal of the silicon substrate base damaged in the first etch procedure, has been developed to be employed in the manufacture of semiconductor devices. Such two-step process provides an improved method for the manufacture of commercially useable semiconductor devices.

The procedures of limiting and removing damage caused to the lattice structure of the silicon substrate base of a semiconductor device during the etch manufacturing process limit certain disadvantageous effects resulting from such damage. These disadvantageous effects are both structural and chemical and may lead to contact resistance problems, breakdown of oxides, and adverse hot electron effects in the semiconductor device. Limiting etch damage and removing damaged portions restores the physical characteristics of the silicon substrate base to essentially those of unetched silicon, reducing such disadvantageous effects.

According to an important feature of the present invention, damage to the silicon substrate base of a manufactured semiconductor device is limited in a first etch procedure as a result of the manner and conditions in which such initial etch procedure is performed. In a preferred embodiment of such initial etch procedure, the procedure is performed using a gas composition which does not include a noble gas and at low pressure and low power. The low pressure employed in the preferred embodiment is about the same or higher than the pressure employed in the prior art etch and yields higher partial pressures of reactant gases due to the absence of a noble gas from such composition. Said gas composition used in the first etch procedure is preferably $CHF_3$ and $CF_4$ in a ratio of about 12 Standard Cubic Centimeters per Minute ("SCCM"): 12 SCCM, although ratios of from about 1:1 to 2:1 at total flows of about 20 to 30 SCCM may alternatively be employed in such procedure.

The present invention further provides for a second removal procedure for etched removal of damaged portions of the silicon substrate base of a semiconductor device produced by a first etch procedure. Such second removal procedure, in a preferred embodiment of the method, would be performed in conjunction with a first etch procedure performed in the manner previously described to limit damage caused in such first etch procedure. Preferably, the second removal procedure is performed using a gas composition which does not comprise carbon or carbon containing compounds and at high pressure and low power.

Sequentially performing both the first etch procedure and the second removal procedure results in reduction of the damage incurred in the first etch procedure and removal, in the second removal procedure, of damage caused in the first etch procedure, thereby returning the physical and chemical characteristics of the silicon substrate base of the semiconductor device to essentially that of unetched silicon. By so limiting the structural and chemical damage associated with the etch process and then removing any such damage in a subsequent etch, adverse effects in the product semiconductor device, such as resistance problems, breakdown of oxides, and adverse hot electron effects, all common results with the prior industry practices, are limited.

BRIEF DESCRIPTION OF THE DRAWINGS

For a more complete understanding of the present invention and for further objects and advantages thereof, reference may now be had to the following description in conjunction with the accompanying drawings sequentially illustrating a representative semiconductor device in various stages of manufacture, in which.

DETAILED DESCRIPTION

Figure 1:
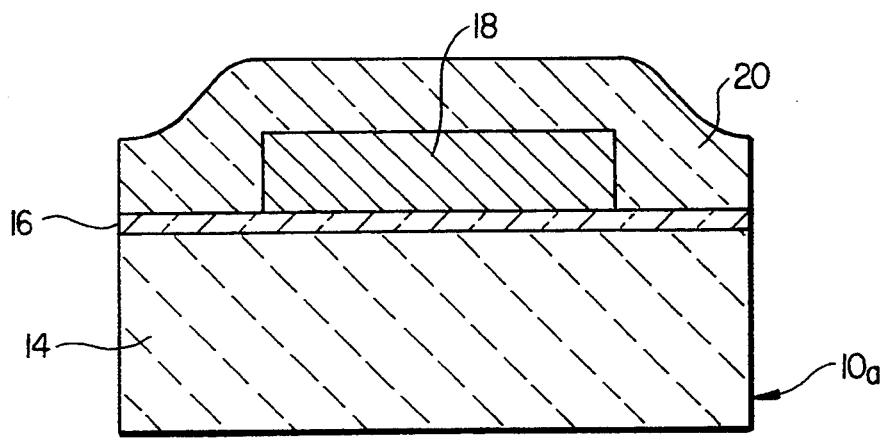
FIG. 1 is an enlarged-scale partial cross-sectional view through an unetched semiconductor device.
Figure 2:
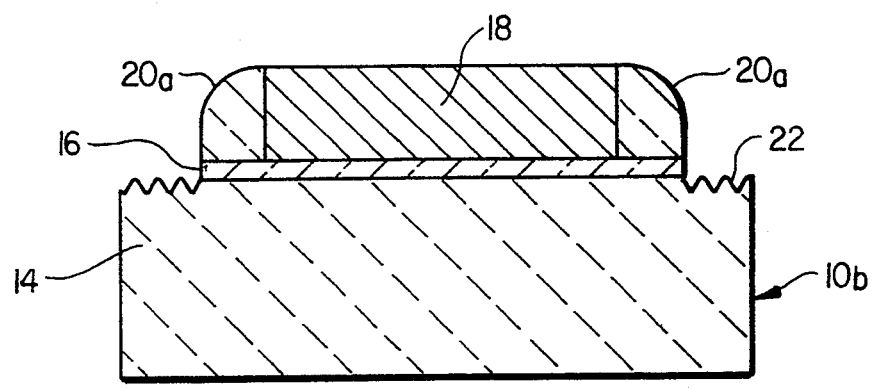
FIG. 2 is an enlarged-scale partial cross-sectional view through a first-etch-step semiconductor device.
Figure 3:
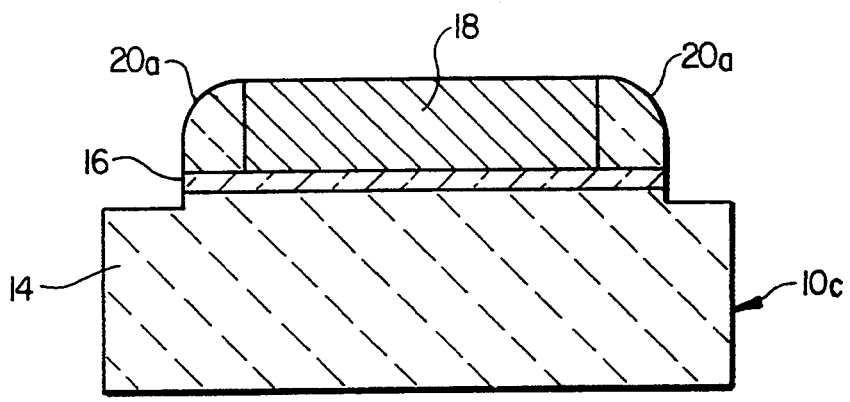
FIG. 3 is an enlarged-scale partial cross-sectional view through a semiconductor device after completion of the removal procedure, a second etch procedure for removal of damaged portions of the silicon substrate base thereof.

As sequentially illustrated in FIGS. 1-3, the present invention provides an improved LDD oxide spacer etch process to be employed in the manufacture of semiconductor devices. The present invention process comprises two steps: a first etch procedure which causes less damage to the semiconductor's silicon substrate base than conventional etch processes and a second removal procedure for etched removal of portions of the silicon substrate base damaged in the first etch procedure. The invention process restores the physical and chemical characteristics and properties of the silicon substrate base of a manufactured semiconductor device to essentially that of unetched silicon. The unetched semiconductor device 10a, the first-etch-step semiconductor device 10b, and the semiconductor device 10c, respectively shown in FIGS. 1, 2, and 3, sequentially depict the stages of the present invention process resulting in the semiconductor device 10c shown in FIG. 3.

Referring now to FIG. 1, an unetched semiconductor device 10a, one example of a workpiece employed with the present invention process, has a silicon substrate base 14 on the top side of which is formed (i) a gate oxide layer 16, (ii) then conductively interconnected structures of poly gate strip 18, and (iii) finally a spacer oxide layer 20 which covers both the poly gate strip 18 and the areas of the gate oxide layer 16 overlying the silicon substrate base 14 which are not covered by the poly gate strip 18. As will be readily appreciated by those skilled in this particular art, the layering and strip arrangement and types of the various conductive and insulative components comprising the unetched semiconductor device 10a, depicted in FIG. 1, are merely illustrative of the wide variety of component arrangements and types typically utilized in manufacture of etched semiconductor devices.

The common practice in the semiconductor industry for manufacturing etched semiconductor devices has been to etch such an unetched semiconductor device 10a with an etching machine, common to the industry, to expose (as desired for the particular application to be made of the product device) the poly gate strip 18 and, referring to FIGS. 1 and 2, to remove (also as desired for the particular application) (a) essentially all of the spacer oxide layer 20 except for bevelled ridges 20a thereof which abut the linear edges of the poly gate strip 18 and (b) all of the gate oxide layer 16 except for the portions thereof layered between the poly gate strip 18 or the bevelled ridges 20a of spacer oxide layer and the silicon substrate base 14. Such removal of the spacer oxide layer 20 by the etch exposes those portions of the silicon substrate base 14 not located essentially under the poly gate strip 18 or the bevelled ridges 20a of spacer oxide layer.

The typical etching machine allows variation of the physical conditions under which the etch is accomplished. Variation of physical conditions of the etch affects the outcome of the etch process, including the characteristics of the semiconductor device produced by the process. Variables which may typically be adjusted in using such an etching machine for performing the etch are the etching gas composition, etching pressure, and etching power.

In such an etching manufacture of a semiconductor device, the common practice in the industry has, prior to the present invention, been to use in such an etching machine an etching gas composition composed at least in part by a noble gas (for example, Ar or He) and to operate the machine under conditions of high power and low pressure. This common practice, however, imparts significant damage to the silicon substrate base during the etch process. The present invention, comprising a two-step etch process, in the first etch procedure etches the spacer oxide layer 20 and the gate oxide layer 16 in a manner which reduces damage to the silicon substrate base 14 and in the second removal procedure removes, by etching, essentially all the portions of the silicon substrate base 14 comprised of damaged silicon caused by the first etch procedure. By reducing and removing damage to the silicon substrate base 14 incurred during the manufacturing process, the present invention substantially improves the product obtained from such process.

As illustrated in FIGS. 1 and 2, the first etch procedure etches (i) the spacer oxide layer 20, as shown in FIG. 1, to expose (as desired for the particular application of the product device) the poly gate strip 18 leaving (as desired for the particular application) bevelled ridges 20a of spacer oxide layer running linearly along sides of the poly gate strip 18, as shown in FIG. 2, and (ii) as shown in FIG. 1, both the spacer oxide layer 20 and the gate oxide layer 16 to expose (as desired for the particular application), as shown in one embodiment in FIG. 2, the portions of the surface of the silicon substrate base 14 not located sandwiched between the poly gate strip 18 or the bevelled ridges 20a of spacer oxide layer and the silicon substrate base 14.

The etch is preferably accomplished using a parallel plate split-powered diode etching machine, such as the Lain Research Corporation Rainbow 4500 system or the TEL (Tokyo Electric) System, although other etching machines such as a magnatron etch system like the AMAT 5000 may be used. The top electrode material in such a machine is preferably graphite or silicon coated. The bottom electrode is polymer-coated anodized aluminum. Use of other electrode materials is possible. In using the etching machine in such first etch procedure, the unetched semiconductor device 10a is preferably held under one of the electrodes with a polymer-coated clamp. The wafer is preferably cooled by a suitable cooling medium, such as helium by employment of a backside helium cooling method. In such a method, the top and bottom electrodes are cooled with an "antifreeze" or water circulation system. In the preferred embodiment, the unetched semiconductor device 10a is cooled to a temperature of approximately −20 degrees C. prior to the etch. In order to polymer-coat the clamp and bottom electrode, the clamp and bottom electrode are preferably covered with Kapton tape to simulate polymeric material that forms during the etch process.

The etch is then performed by such a machine (1) using a gas composition which does not contain a noble gas, such as a mixture of $CHF_3/CF_4$, (2) at low power, less than about 325 Watts for a time period sufficient to form (as desired for the particular application of the product device) the bevelled ridges 20a of spacer oxide layer and remove (also as desired for the particular application) the gate oxide layer 16, then continuing such etch under further reduced power such as about 165 Watts, 85 Watts, and 45 Watts for additional consecutive periods of about 5 to 15 seconds each, and (3) at low pressure (about the same or higher than prior art etch conditions), about 300 to 500 mTORR or greater. Time periods for the etch at such an initial power of less than about 325 Watts which are generally sufficient to sufficiently form bevelled ridges 20a of spacer oxide layer and sufficiently remove gate oxide layer 16 range, based on the thickness of the etched device, according to a factor of about 3000 to 6000 Angstroms/minute. Further, the first etch procedure is enhanced by increasing the $CHF_3$ to $CF_4$ gas flow ratio such that a mixture of about 12 SCCM of $CHF_3$ and about 12 SCCM of $CF_4$ flows during such etch, although ratios of from about 1:1 to 2:1 at total flows of about 20 to 30 SCCM may alternatively be employed in such procedure.

Such a first etching procedure, as well as other etching processes exhibited by the prior art, result in a first-etch-step semiconductor device 10b, for example, having an exposed poly gate strip 18 with linearly abutting bevelled ridges 20a of remaining spacer oxide layer, such poly gate strip 18 and bevelled ridges 20a of spacer oxide layer being underlaid by a gate oxide layer 16 which is situated atop the silicon substrate base 14, said silicon substrate base 14 having substantially exposed surfaces where not topped by the gate oxide layer 16. Such first-etch-step semiconductor device 10b obtained by the present invention is similar in configuration to the semiconductor device obtained by the etch processes common to the industry, except that damage to the silicon substrate base 14, illustrated in FIG. 2 by the damaged portions 22, is reduced in the present invention process.

Referring to FIG. 3, the second removal procedure removes, by etching, the damaged portions 22 of the silicon substrate base 14. This removal procedure is preferably accomplished using the same etching machine used in the first procedure, and configuration of the machine, including diodes, electrodes, and clamp, is also preferably the same as that used in the first procedure, although several different types of etching machines and configurations could also be used as with the first etch procedure. Additionally, this removal procedure is preferably used in conjunction with and subsequent to the first etch procedure, although such second removal procedure could also be employed in conjunction with prior art or other etch processes. The removal procedure is performed using a gas that does not comprise carbon or carbon containing compounds, preferably a mixture of $SF_6$ without an inert gas, but which could also be a mixture of $SF_6/Ar$, $SF_6/He$, or some other gas or mixture. This removal procedure is further preferably performed under etching machine conditions of high pressure, about 700 to 900 mTORR or higher, and low power, about 35 Watts or less, although other pressures and powers could be employed. Such a removal procedure removes damaged portions 22 of the silicon substrate base 14 restoring the physical and chemical characteristics of the silicon substrate base 14 to essentially that of the unetched semiconductor device 10a. To applicant's knowledge, such an etch procedure, as the removal procedure, for damage removal has not been practiced by the industry prior to the present invention.

The foregoing detailed description is to be clearly understood as being given by way of illustration and example only, the spirit and scope of the present invention being limited solely by the appended claims.

What is claimed is:

1. A method of manufacturing a semiconductor device from a workpiece formed in part of a silicon substrate base, comprising an etch procedure of etching, in a manner and under conditions which limit the extent of damaged portions to the silicon substrate base, said etch procedure being performed using a gas composition essentially devoid of a noble gas, resulting, at least in part, in a first-etch-step semiconductor device characterized by bevelled ridges of a spacer oxide layer linearly abutting a poly gate strip lying atop a gate oxide layer which tops the silicon substrate base only where sandwiched between the poly gate strip and the silicon substrate base, wherein said etch procedure of etching said workpiece is performed at an initial power of less than about 325 Watts for a time period to sufficiently form bevelled ridges of spacer oxide layer and to sufficiently remove gate oxide layer, then at a power of less than about 165 Watts for about 5 to 15 seconds, then at a power of less than about 85 Watts for about 5 to 15 seconds, and finally at a power of less than about 45 Watts for about 5 to 15 seconds.

2. A method of manufacturing a semiconductor device from a workpiece formed in part of a silicon substrate base, comprising an etch procedure of etching, in a manner and under conditions which limit the extent of damaged portions to the silicon substrate base, said etch procedure being performed using a gas composition essentially devoid of a noble gas, resulting, at least in part, in a first-etch-step semiconductor device characterized by bevelled ridges of a spacer oxide layer linearly abutting a poly gate strip lying atop a gate oxide layer which tops the silicon substrate base only where sandwiched between the poly gate strip and the silicon substrate base, wherein said etch procedure of etching said workpiece is performed at an initial power of less than about 325 Watts for a time period to sufficiently form bevelled ridges of spacer oxide layer and to sufficiently remove gate oxide layer, then at a power of less than about 165 Watts for about 5 to 15 seconds, then at a power of less than about 85 Watts for about 5 to 15 seconds, and finally at a power of less than about 45 Watts for about 5 to 15 seconds, wherein said etch procedure of etching said workpiece is performed at a pressure of greater than about 300 mTORR.

3. A method of manufacturing a semiconductor device from a workpiece formed in part of a silicon substrate base, comprising an etch procedure of etching, in a manner and under conditions which limit the extent of damaged portions to the silicon substrate base, said etch procedure being performed using a gas composition essentially devoid of a noble gas, resulting, at least in part, in a first-etch-step semiconductor device characterized by bevelled ridges of a spacer oxide layer linearly abutting a poly gate strip lying atop a gate oxide layer which tops the silicon substrate base only where sandwiched between the poly gate strip and the silicon substrate base, wherein said etch procedure of etching said workpiece is performed at an initial power of less than about 325 Watts for a time period to sufficiently form bevelled ridges of spacer oxide layer and to sufficiently remove gate oxide layer, then at a power of less than about 165 Watts for about 5 to 15 seconds, then at a power of less than about 85 Watts for about 5 to 15 seconds, and finally at a power of less than about 45 Watts for about 5 to 15 seconds, wherein said etch procedure of etching said workpiece is performed at a pressure of about 300 to about 500 mTORR.

4. A method of manufacturing a semiconductor device from a workpiece formed in part of a silicon substrate base, comprising an etch procedure of etching, in a manner and under conditions which limit the extent of damaged portions to the silicon substrate base, said etch procedure being performed using a gas composition essentially devoid of a noble gas, resulting, at least in part, in a first-etch-step semiconductor device characterized by bevelled ridges of a spacer oxide layer linearly abutting a poly gate strip lying atop a gate oxide layer which tops the silicon substrate base only where sandwiched between the poly gate strip and the silicon substrate base, wherein said etch procedure of etching said workpiece is performed at an initial power of less than about 325 Watts for a time period to sufficiently form bevelled ridges of spacer oxide layer and to sufficiently remove gate oxide layer, then at a power of less than about 165 Watts for about 5 to 15 seconds, then at a power of less than about 85 Watts for about 5 to 15 seconds, and finally at a power of less than about 45 Watts for about 5 to 15 seconds, wherein said etch procedure of etching said workpiece is performed at a pressure of greater than about 300 mTORR and wherein said gas composition is $CHF_3$ and $CF_4$ flowing in a ratio of about 1:1 to 2:1 and total flows of about 20 to about 30 SCCM.

5. A method of manufacturing a semiconductor device from a workpiece formed in part of a silicon substrate base, comprising an etch procedure of etching, in a manner and under conditions which limit the extent of damaged portions to the silicon substrate base, said etch procedure being performed using a gas composition essentially devoid of a noble gas, resulting, at least in part, in a first-etch-step semiconductor device characterized by bevelled ridges of a spacer oxide layer linearly abutting a poly gate strip lying atop a gate oxide layer which tops the silicon substrate base only where sandwiched between the poly gate strip and the silicon substrate base, wherein said etch procedure of etching said workpiece is performed at an initial power of less than about 325 Watts for a time period to sufficiently form bevelled ridges of spacer oxide layer and to sufficiently remove gate oxide layer, then at a power of less than about 165 Watts for about 5 to 15 seconds, then at a power of less than about 85 Watts for about 5 to 15 seconds, and finally at a power of less than about 45 Watts for about 5 to 15 seconds, wherein said etch procedure of etching said workpiece is performed at a pressure of greater than about 300 mTORR and wherein said gas composition is $CHF_3$ and $CF_4$ flowing in a ratio of about 1:1 to 2:1 and total flows of about 20 to about 30 SCCM, further comprising a removal procedure of a second etching to remove essentially all the damaged portions of the silicon substrate base, with a gas composition selected from the group consisting of a mixture of $SF_6$ and He, a mixture of $SF_6$ and Ar, and $SF_6$, performed at a pressure of higher than about 700 mTORR and a power of less than about 35 Watts.

* * * * *